（12) United States Patent
Fazelpour

(10) Patent No.: US 6,424,541 B1
(45) Date of Patent: Jul. 23, 2002

(54) ELECTRONIC DEVICE ATTACHMENT METHODS AND APPARATUS FOR FORMING AN ASSEMBLY

(75) Inventor: Siamak Fazelpour, Irvine, CA (US)

(73) Assignee: Conexant Systems, INC, Newport Beach, CA (US)

( * ) Notice: Subject to any disclaimer, the term of this patent is extended or adjusted under 35 U.S.C. 154(b) by 0 days.

(21) Appl. No.: 09/295,562

(22) Filed: Apr. 21, 1999

(51) Int. Cl.[7] ................................................. H05K 7/02
(52) U.S. Cl. ........................ 361/760; 361/762; 361/764; 361/772; 361/807; 361/813; 257/666; 438/117; 438/120
(58) Field of Search ................................ 361/760, 762, 361/764, 767, 772, 783, 807, 813; 257/778, 738, 779, 679, 666, 51; 438/117, 120

(56) References Cited

U.S. PATENT DOCUMENTS

| | | | | |
|---|---|---|---|---|
| 4,942,454 A | * | 7/1990 | Mori et al. | 257/676 |
| 5,097,317 A | * | 3/1992 | Fujimoto et al. | 257/786 |
| 5,107,325 A | * | 4/1992 | Nakayoshi | 257/793 |
| 5,331,205 A | * | 7/1994 | Primeaux | 257/790 |
| 5,394,298 A | * | 2/1995 | Sagisaka | 361/704 |
| 5,438,478 A | * | 8/1995 | Kondo et al. | 361/704 |
| 5,629,566 A | * | 5/1997 | Doi et al. | 257/789 |
| 5,669,137 A | * | 9/1997 | Ellerson et al. | 29/840 |
| 5,723,907 A | * | 3/1998 | Akram | 257/723 |
| 5,770,480 A | * | 6/1998 | Ma et al. | 438/123 |
| 5,855,821 A | * | 1/1999 | Chau et al. | 252/514 |
| 5,943,212 A | * | 8/1999 | Horiuchi et al. | 361/704 |
| 5,973,404 A | * | 10/1999 | Akram et al. | 257/778 |
| 5,982,041 A | * | 11/1999 | Mitani et al. | 257/783 |

* cited by examiner

Primary Examiner—Darren Schuberg
Assistant Examiner—David Foster
(74) Attorney, Agent, or Firm—Farjami & Farjami LLP

(57) ABSTRACT

Improved methods and apparatus for forming an assembly by attaching an electronic package to a substrate are disclosed. The electronic package includes a microelectronic device, conductive leads to couple the device to the substrate, and an encapsulant surrounding the device and a portion of the conductive leads. A filler is added to the assembly to surround the otherwise exposed portion of the leads. The filler material is selected such that the dielectric constant of the filler is approximately the same as the dielectric constant of the encapsulant. Surrounding the lead with material having substantially similar dielectric constants reduces impedance variation along the length of the lead.

14 Claims, 2 Drawing Sheets

ELECTRONIC DEVICE ATTACHMENT METHODS AND APPARATUS FOR FORMING AN ASSEMBLY

FIELD OF THE INVENTION

The present invention generally relates to methods and apparatus for attaching electronic devices to a substrate to form an assembly. More particularly, the present invention relates to techniques for coating a lead of a device including a leaded package to reduce impedance variation along the length of the lead.

BACKGROUND OF THE INVENTION

Microelectronic devices such as semiconductor devices are often packaged to, among other things, protect the device from mechanical damage, chemical attack, light, extreme temperature cycles, and other environmental effects. The packaging also provides mechanical support for the device and facilitates handling of the device for subsequent attachment to a substrate such as a printed circuit board. If desired, the package may also provide heat dissipation for the device. Although microelectronic packages may include a variety of forms to perform various functions, in general, the package includes a support to receive the device and encapsulating material to surround and protect the device from the surrounding environment.

The support often includes a leadframe that is configured to receive the microelectronic device and facilitate electrical coupling of the device to the substrate. Using a leadframe as a support may be advantageous because the leadframe is relatively inexpensive, is relatively reliable, and techniques for attaching devices to the leadframe and the leadframe to the substrate are relatively well understood. However, as discussed in more detail below, use of leadframes to attach devices to a substrate may be problematic in some respects. In particular, the impedance along a portion conductive path between the microelectronic device and the substrate (e.g., along a portion of the lead of the leadframe) may be relatively high due in part to the environment surrounding the lead and the length of the lead, which is often a few millimeters. In addition, as discussed below, the impedance may vary over the length of the lead, causing additional problems.

The leadframe is generally formed of conductive material (e.g., a thin sheet of metal such as copper) and includes a pad or paddle portion configured to receive various electronic components and leads that are configured to be mechanically and/or electrically coupled to the substrate. The pad and lead regions of the leadframe are commonly formed by stamping or etching portions of the conductive material to form the conductive leads and a centrally located pad; the leads of the leadframe are generally eventually electrically isolated from other leads and the pad.

To mechanically and electrically connect the device to the substrate, the device is adhesively attached to the pad of the leadframe and electrical contacts between the device and the leads are formed by wire bonding using thin conductive wires. Because the leads form electrical connections between the device and the substrate, each active input and output region of the device is coupled to a lead. The leadframe may then be mechanically attached and electrically coupled to the substrate by soldering the leads of the leadframe to bond pads located on the substrate.

Encapsulating methods and apparatus are generally configured to surround the microelectronic device, the wire bonds connecting the device to the leadframe, and a portion of the leadframe with an encapsulant, leaving at least a portion of the leads exposed to the surrounding environment. The non-encapsulated lead portion is free to connect the packaged device to the substrate.

Leaving a portion of the lead exposed to the environment may be problematic in several regards. For example, the exposed lead is susceptible to mechanical and chemical attack. In addition, the exposed lead portion may be undesirable because the impedance along the lead is dependent on the environment surrounding the lead. Thus, the impedance along the path of the lead changes as the environment surrounding the lead goes from an encapsulated environment to a non-encapsulated environment. In fact, the impedance variation between an encapsulated portion and non-encapsulated portion of the lead may be twenty ohms or more. Accordingly, assembly methods and apparatus that mitigate exposure of a lead to the surrounding environment are desirable.

The change of impedance along the length of the package lead may detrimentally affect the packaged device performance, particularly in high speed devices. In particular, electronic signals may be susceptible to distortion, which may be due to signal reflection. For example, when an electronic signal is transmitted from one device (e.g., a driver) to another device (e.g., a receiver) connected to the same substrate, signal reflection may occur if the signal travels through conductive media having different impedance values. This signal distortion may result in reduced device isolation and loss of signal quality. Accordingly, microelectronic device assembly methods and apparatus that reduce impedance variation along the length of a signal path are desirable.

Because impedance in a line is inversely proportional to the square root of the capacitance in the line, prior art methods for adjusting impedance in a lead line include increasing the line capacitance. The capacitance is increased by increasing the width of the lead line and/or decreasing the spacing between adjacent leads. However, these methods generally only allow for impedance adjustments of about one ohm. Accordingly, improved methods and apparatus for adjusting impedance values on a lead are desirable.

Other methods for reducing impedance variation between devices include using alternative packaging systems such as ball grid array modules or two-layer flexible circuits having signal lines. Although these systems reduce impedance variation, they may be less reliable and more expensive than leadframe packages. Therefore, the improved methods and apparatus for reducing impedance variation in an assembly preferably include use of leadframe packages.

SUMMARY OF THE INVENTION

The present invention provides improved methods and apparatus for attaching electronic devices to a substrate to form an assembly. While the ways in which the present invention addresses the drawbacks of the now-known device attachment techniques and apparatus are described in greater detail hereinbelow, in general and in accordance with various aspects of the present invention, the leads of a leaded package are coated such that the variation of impedance along the length of the lead is reduced.

In accordance with an exemplary embodiment of the present invention, exposed portions of the leads are coated with a material having a dielectric constant that is substantially the same as the dielectric constant of material surrounding the device. In accordance with one aspect of this embodiment, the lead coating also has a dielectric constant that is similar in value to the dielectric constant of the material surrounding conductive lines on the substrate.

In accordance with a further exemplary embodiment of the present invention, the exposed portions of the leads are coated with a material having a dielectric constant of about three to about five.

In accordance with another exemplary embodiment of the present invention, the device is attached to a leadframe, the active portions of the device are electrically coupled to the leads of the leadframe, the device and a portion of the leads are coated with an encapsulating material, the leadframe package is attached to the substrate, and the exposed portion of the leads are coated with a material.

In accordance with yet a further embodiment of the present invention, the impedance variation along the length of the lead may be further reduced by manipulating the line width and/or the spacing between the lead lines.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

DETAILED DESCRIPTION OF EXEMPLARY EMBODIMENTS

The present invention generally relates to microelectronic device packaging and techniques for attaching the packaged devices to a substrate to form an assembly. In particular, the invention relates to methods and apparatus for mechanically and electrically coupling a microelectronic package including one or more electronic devices to a substrate. Although the present invention may be used to couple a variety of devices to a variety of substrates using various packaging techniques, the present invention is conveniently described below in connection with a device including a leadframe package.

Figure 1:
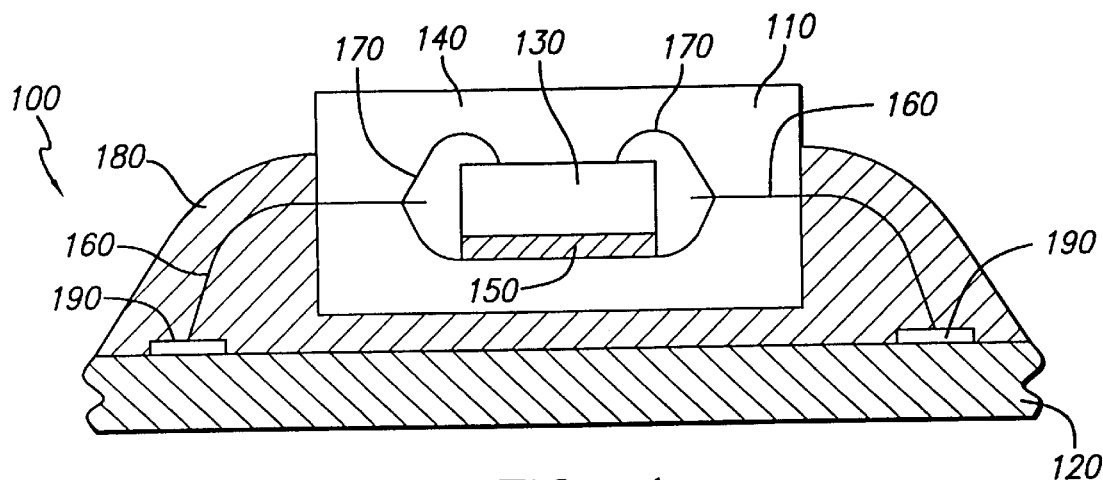
FIG. 1 illustrates, in cut-away view, a portion of an assembly including an electronic device attached to a substrate in accordance with the present invention.

FIG. 1 illustrates a portion of an assembly 100, including an electronic device 110 coupled to a substrate 120 in accordance with an exemplary embodiment of the present invention. In accordance with the invention, assembly portion 100 also includes filler 180. The assembly is generally configured to integrate device 110 with one or more electrical components attached to substrate 120. For example, the assembly may be configured to mount the packaged device on a printed circuit board as next level packaging.

In general, device 110 facilitates electrical and mechanical coupling to one or more components located within device 110, while protecting the component(s) from the surrounding environment (e.g., damage that might occur by exposure to chemicals, mechanical attack, light, heat, or the like). In addition, device 110 may be designed to assist handling of various components (e.g., microelectronic devices) during formation of assembly portion 100.

As illustrated in FIG. 1, device 110 suitably includes a chip or component 130, an encapsulant 140, leadframe components 150 and 160, and conductive media such as wires 170. To form electrical and mechanical connections to chip 130, chip 130 is attached to leadframe components 150 and 160, and leadframe component 160 is coupled to substrate 120. Encapsulant 140 and filler 180 help protect chip 130, component 160, and wires 170 from damage. Although device 110 may include virtually any number of devices or components 130 or other electrical components, for the sake of brevity and clarity, device 110 including a single component 130 is described herein.

Assemblies may be designed to integrate one or more devices 110 to one or more electrical components (e.g., chip 130) coupled to substrate 120. Accordingly, substrate 120 may include one or more layers of conductive material that include metal lines and the layers may be coupled to each other by, for example, drilling holes through the various conductive layers (which are generally isolated using dielectric or insulating material such as resin compounds) and coating the hole with conductive material.

The configuration of substrate 120 may vary from application to application. For example and as noted above, substrate 120 may include a printed circuit board configured to receive multiple devices 110 and, if desired, other electrical components to form the assembly. Alternatively, substrate 120 may include flex circuit material, ceramics, or any other media configured to receive one or more electronic devices.

Substrate 120 may include structures such as a bond pad 190 to facilitate electrical or mechanical attachment of device 110 to substrate 120. Alternatively, substrate 120 may include through holes or indentations and portions 160 of device 110 may be pressed into the through holes or indentations to mechanically and electrically couple device 110 to substrate 120.

Chip 130 may include virtually any electrical device and may vary from application to application. For example, in one configuration, chip 130 may include a driver configured to attach to substrate 120, and in another configuration, chip 130 may include a receiver configured to attach to substrate 120 and receive a signal from an attached driver.

Encapsulant 140 may be any material capable of protecting chip 130. For example, material 140 may include plastics, ceramics, or a metal casing. In accordance with an exemplary embodiment of the present invention, material 140 includes a thermoset epoxy material, a thermoplastic material, or a reaction injection molding material.

Figure 2:
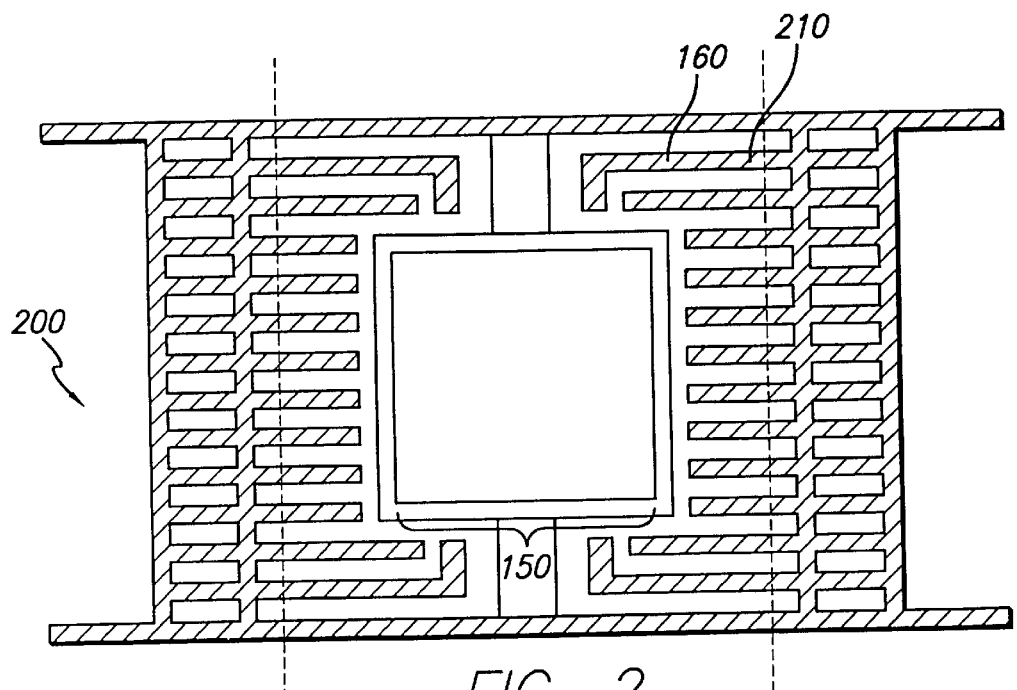
FIG. 2 schematically illustrates a leadframe package as is known in the art.

Leadframe components 150 and 160 typically originate from a leadframe 200, which is illustrated in FIG. 2. Leadframe 200 is generally formed by stamping or etching a pattern into a sheet of conductive material. The conductive material may include, for example, a metal such as copper or alloy 42 (an alloy comprising about 42% iron and 58% nickel) that is stamp-cut or punched to form the structure illustrated in FIG. 2. As discussed in greater detail below, leadframe 200 may be cut along the dashed lines to form structures 150 and 160 illustrated in FIG. 1.

Leadframe component 150 is designed to facilitate the electrical and mechanical coupling of one or more components 130 thereto. Electrical and mechanical coupling of component 130 to leadframe is accomplished by using a conductive epoxy or solder material as is well known in the art.

Leadframe component 160 (also known as a lead) may be plated or otherwise provided with a coating that will facilitate both the connection of wires 170 to component 160 and also the connection of component 160 to the substrate. For example, components 160 may include a thin layer of silver (e.g., about 4 μm) to assist mechanical and electrical coupling of component 160 to wire 170. Alternatively, component 160 may be coated with thin layers of nickel and palladium to assist bonding wire 170 to component 160. Component 160 may also suitably include solder such as a lead-tin alloy at exposed tips 210 of portion 160. In an exemplary embodiment, the solder consists of about 85% tin and about 15% lead.

Wires 170 suitably provide electrical connections between the input and output portions of chip 130 and leads 160. Wires 170 may include any medium suitable for conduction of electricity. For example, wires 170 may include small conductive bumps suitable for tape automated bonding, flip chip bonding, or the like. However, in accordance with an exemplary embodiment of the present invention, wires 170 include thin metallic (e.g., gold) wires that are approximately 30 μm in diameter. The wire metals may include copper, gold, compounds including these metals, or the like.

As noted above, substrate 120 may include bond pads 190 to facilitate mechanical and electrical attachment of device 110 to substrate 120. Material used for pad 190 may vary from application to application. For example, pad 190 may be formed of material including copper, nickel, and gold that is deposited onto substrate 120 using plating technology. However, in accordance with a preferred embodiment of the present invention, pads 190 include a solder material such as an alloy of 85% tin and 15% lead, which is preferably plated onto substrate 120.

In accordance with an exemplary embodiment of the present invention, filler 180 is applied to assembly portion 100 to reduce impedance variation along a conductive path of a signal traveling to or from chip 130. The impedance variation is reduced by reducing the change in capacitance over the conductive path, and the change in capacitance is reduced by reducing the variation of the dielectric constants of materials surrounding the conductive path. The relationship between impedance of the lead and the dielectric constants can be explained by the following equations:

$$Z = (L/C)^{1/2} \quad (I)$$

$$C = \in_o \in_r A/d \quad (II)$$

where Z is impedance, L is inductance, C is capacitance for a parallel plate, $\in_o$ is the dielectric constant of free space, $\in_r$ is the relative dielectric constant, A is the area of overlap between two parallel plate capacitors, and d is the distance between the parallel plates.

When the dielectric material surrounding a portion of the conductive path (e.g., leadframe portion 160) is changed from approximately 1 (the value for air) to approximately 4 (a value for a liquid encapsulant), the capacitance for that portion of the conductive path changes by a factor of 4, and the impedance changes by a factor of 2. Accordingly, substantial changes in impedance along a conductive path may be obtained by adjusting the dielectric constant of material surrounding the conductive path such as by applying filler 180 to any portion of the conductive path that might otherwise be exposed to air.

Filler 180 preferably includes material having a dielectric constant that is similar in value to the dielectric constant of encapsulant 140, to dielectric material in substrate 120, or both. In particular, filler 180 preferably includes material having a dielectric constant of greater than about 1 to about 6 and more preferably about 3 to about 5. Materials that may be used for filler 180 include liquid encapsulant such as Globe Top that is manufactured by The Materials Research Laboratory of Taiwan and plastic mold material. Similar to encapsulant 140 material, filler 180 may include additional materials to block light, make filler 180 fire retardant, and the like.

Figure 3:
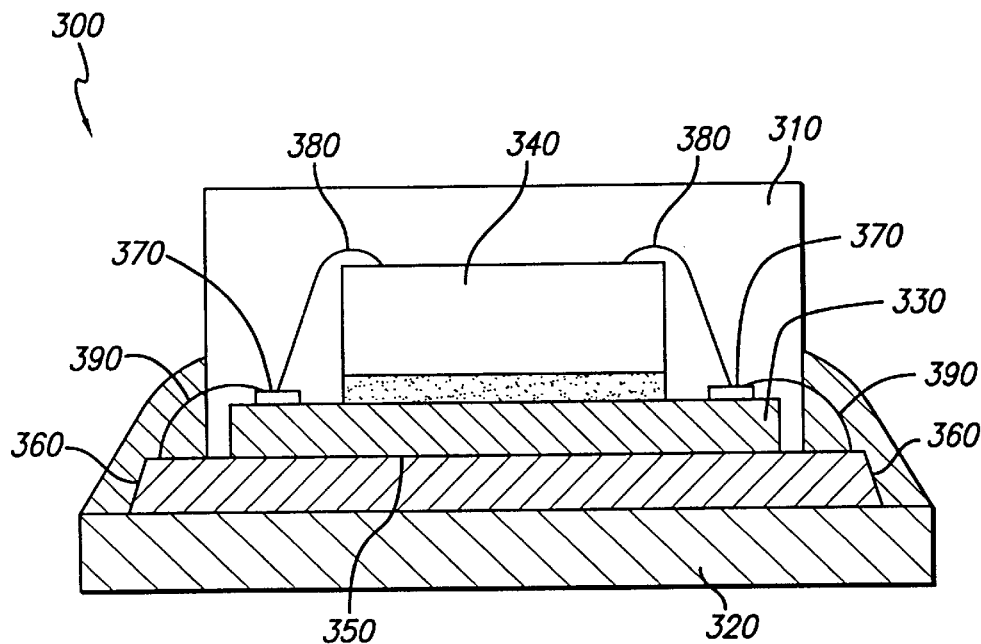
FIG. 3 illustrates, in side cut-away view, a portion of an assembly including an electronic device attached to a substrate in accordance with an alternate embodiment of the present invention.

A portion 300 of an assembly in accordance with an alternate embodiment is illustrated in FIG. 3. Similar to portion 100, portion 300 includes a device 310 coupled to a substrate 320. However, unlike the embodiment illustrated in FIG. 1, portion 300 includes a base 330 that is coupled to, and if desired, integrated with, one or more electrical components. The addition of base 330 facilitates integration of one or more electrical components attached to base 330 prior to attaching base 330 to substrate 320.

Device 310 suitably includes a component or chip 340 that is coupled to base 330, which in turn is coupled to leadframe components 360 and 370 (which are similar to leadframe components 150 and 160). In an exemplary embodiment of the present invention, component 340 is bonded to base 330 using die bonds and electrically coupled to base 300 using wire bonds (e.g., gold wires having a diameter of approximately 25–33 μm) to couple the input/output structures on chip 340 to base 330. However, chip 340 may be coupled to base 350 using any suitable means.

Base 330 may include any material suitable for coupling to device 310. For example, base 330 may include a laminate such as a printed circuit board having one or more conductive layers. Alternatively, base 330 may include ceramic or other dielectric materials having one or more conductive layers integral therewith. Base 330 may also suitably include bond pads 370 that may be formed of, for example, a lead-tin alloy including about 85% tin and about 15% lead. Pads 370 may be used to receive connectors 380 that couple component 340 to base 330 and connectors 390 that couple base 330 to substrate 320.

Figure 4:
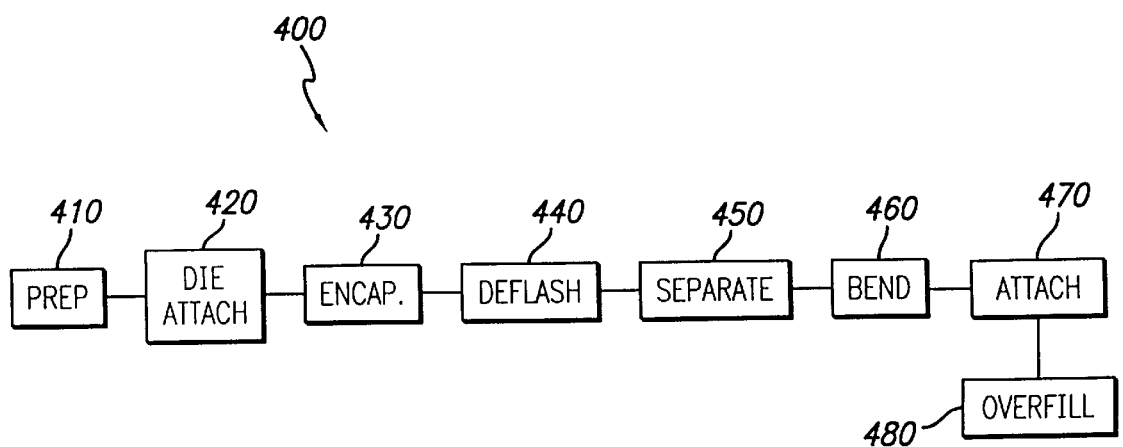
FIG. 4 schematically illustrates an exemplary process to form an assembly in accordance with the present invention.

An exemplary process flow 400 for forming an assembly (e.g., portion 100 shown in FIG. 1) is presented in FIG. 4. In general, process 400 includes a leadframe preparation step 410, a die attachment step 420, an encapsulating step 430, a deflash step 440, a separation step 450, a bending step 460, an attachment step 470, and an overfill step 480.

Leadframe preparation step 410 may include a variety of substeps that are interchangeable and that vary from application to application. Nevertheless, in accordance with an exemplary embodiment of the present invention, step 410 includes cleaning and/or etching the surface leadframe 200 as illustrated in FIG. 2. Step 410 may also include masking, cleaning, and plating substeps to pattern and deposit materials such as silver to assist subsequent bonding to leadframe components (e.g., components 150, 160).

During die attach step 420, the electrical components are attached to leadframe 200 and electrical connections between the input and output portions of the device and portions 160 of leadframe 200 are formed. The electrical component (e.g., chip 130) may be attached to component 150 of leadframe 200 by placing an adhesive such as silver filled epoxy between the device and component 150. Electrical connections between the input/output portions of the device may then be formed by attaching conductive wires between the input/output portions of the component and portion 160.

After the component is attached to leadframe components 150 and 160, the component, wires 170, portion 150 of leadframe 200 and part of portion 160 are encapsulated during step 430. The components are encapsulated by placing the components and encapsulant material into a mold and injecting an encapsulant material such that the encapsulating material surrounds chip 130, component 150, wires 170, and part of components 160, as shown in FIG. 1.

Excess encapsulant material may be removed from leadframe 200 during deflash step 440. Step 440 may include chemical or mechanical means or a combination thereof to remove the excess encapsulant material. For example, water jets may be used to mechanically remove excess plastic resin material from the surface of leadframe 200.

Next, leadframe 200 may be cut (as shown by the dotted lines in FIG. 2) to separate components 160 during step 450. After portions 160 are separated, portion 160 may be formed (bent) during step 460.

Device 110 may then be attached to substrate 120 during step 470 by attaching the formed portion 160 to substrate 120. Step 470 may suitably include soldering portion 160 to pads 190 of substrate 120.

After device 110 is attached to substrate 120, filler 180 is formed around the otherwise exposed portion of lead 160. In accordance with an exemplary embodiment of the present invention, filler 180 material may be applied to assembly portion 100 by dispensing liquid encapsulant onto the surface of portion 100. In particular, the liquid encapsulant may be dispensed using a dispenser such that the encapsulant forms a seal around leadframe portions 160. Alternatively, filler 180 may be formed using mold techniques.

If desired, the impedance along the length of leads 160 may be further manipulated by adjusting the spacing between adjacent leads 160 and/or by adjusting the width of leads 160. The relationship between line width, lead 160 spacing, and impedance is illustrated by Equations (I) and (II) above.

Although the present invention is set forth herein in the context of the appended drawing figures, it should be appreciated that the invention is not limited to the specific form shown. For example, while inventive methods and apparatus are conveniently described in connection with leadframe packages, various other types of packages such as leadless chip carriers, plastic quad flat packs, and the like may be used in accordance with the present invention. Various other modifications, variations, and enhancements in the design and arrangement of the package attachment methods and apparatus as set forth herein may be made without departing from the spirit and scope of the present invention as set forth in the appended claims.

I claim:

1. A microelectronic assembly comprising:
   an electronic device including at least one electrical component and a leadframe including a lead having first and second parts, wherein said lead is electrically coupled to said at least one electrical component;
   an encapsulant formed of a first material in contact with said at least one electrical component and said first part of said lead, said first material having a first dielectric constant and said first part of said lead having a first impedance;
   a substrate electrically coupled to said lead, wherein said substrate includes an insulating material; and
   a filler formed of a second material surrounding said second part of said lead and in contact with said substrate, said second material having a second dielectric constant and said second part of said lead having a second impedance;
   said second dielectric constant being selected so as adjust said second impedance of said second part of said lead relative to said first impedance of said first part of said lead.

2. The microelectronic assembly of claim 1, wherein said filler includes a liquid encapsulant.

3. The microelectronic assembly of claim 1, further comprising a base coupled to said at least one electrical component.

4. A method for attaching an electronic device to a substrate to form an assembly, said method comprising steps of:
   providing said electronic device having an encapsulant and leads configured to attach to said substrate, wherein a first portion of said leads are covered by said encapsulant and wherein a second portion of said leads are not covered by said encapsulant, said encapsulant having a first dielectric constant;
   attaching said electronic device to said substrate; and
   applying a filler to at least a part of said second portion of said leads and said substrate, said filler having a second dielectric constant, wherein said second dielectric constant is selected so as adjust a first impedance of said first portion of said leads relative to a second impedance of said second portion of said leads.

5. The method according to claim 4, wherein said applying said filler step includes the step of dispensing filler material onto said assembly.

6. The method according to claim 4, wherein said applying said filler step includes distributing a liquid encapsulant onto said at least said part of said second portion of said leads.

7. The method according to claim 4, further including a step of manipulating said first and second impedances by adjusting a spacing between said leads.

8. The method according to claim 4, further including a step of manipulating said first and second impedances by adjusting a width of said leads.

9. An electronic assembly comprising:
   a device including an electronic component, a leadframe having first and second portions, and an encapsulant in contact with said first portion of said leadframe, said encapsulant having a first dielectric constant;
   a substrate including a printed circuit board, wherein said substrate is electrically coupled to said device; and
   a filler surrounding at least a part of said second portion of said leadframe, said filler in contact with said substrate, said filler having a second dielectric constant, wherein said second dielectric constant is selected so as to adjust a first impedance of said first portion of said leadframe relative to a second impedance of said second portion of said leadframe.

10. The electronic assembly according to claim 9, wherein said filler includes a liquid encapsulant.

11. The electronic assembly according to claim 9, wherein said second dielectric constant is between about 3 and about 5.

12. The microelectronic assembly of claim 1 wherein said second dielectric constant is selected to be greater than 1.0.

13. The microelectronic assembly of claim 12 wherein said second dielectric constant is selected to be smaller than 6.0.

14. The microelectronic assembly of claim 12 wherein said second dielectric constant is selected to be greater than 3.0 and smaller than 5.0.

\* \* \* \* \*